United States Patent
Emura et al.

(10) Patent No.: US 11,703,714 B2
(45) Date of Patent: Jul. 18, 2023

(54) LIGHT-EMITTING MODULE, SURFACE LIGHT SOURCE, AND LIQUID-CRYSTAL DISPLAY DEVICE

(71) Applicant: NICHIA CORPORATION, Anan (JP)

(72) Inventors: Keiji Emura, Anan (JP); Toshinobu Katsumata, Fujiyoshida (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/045,443

(22) Filed: Oct. 10, 2022

(65) Prior Publication Data

US 2023/0059057 A1 Feb. 23, 2023

Related U.S. Application Data

(63) Continuation of application No. 17/443,349, filed on Jul. 26, 2021, now Pat. No. 11,506,932.

(30) Foreign Application Priority Data

Jul. 31, 2020 (JP) .................................. 2020-130780

(51) Int. Cl.
*G02F 1/13357* (2006.01)
*H01L 27/15* (2006.01)

(52) U.S. Cl.
CPC .. *G02F 1/133603* (2013.01); *G02F 1/133605* (2013.01); *H01L 27/156* (2013.01)

(58) Field of Classification Search
CPC ........... G02F 1/133603; G02F 1/33605; H01L 25/0753
See application file for complete search history.

(56) References Cited

U.S. PATENT DOCUMENTS

2016/0291235 A1\* 10/2016 Oh .................... G02F 1/133603
2018/0335559 A1 11/2018 Cho
2019/0294004 A1 9/2019 Hashimoto

FOREIGN PATENT DOCUMENTS

JP 2010282009 A 12/2010
JP 2019175846 A 10/2019
(Continued)

OTHER PUBLICATIONS

Notice of Allowance, United States Patent and Trademark Office, issued to U.S. Appl. No. 17/443,349 dated Jul. 15, 2022, 8 pages.

*Primary Examiner* — Britt D Hanley
(74) *Attorney, Agent, or Firm* — Hunton Andrews Kurth LLP

(57) ABSTRACT

Darkening of the periphery of a light-emitting module in which a plurality of light-emitting units are two-dimensionally arranged is reduced.
The present light-emitting module has a light-emitting region including a plurality of light-emitting units two-dimensionally arranged, the light-emitting units each including a light-guiding plate having a first main surface, a first recess opening toward the first main surface, a second main surface opposite to the first main surface, and a second recess opening toward the second main surface; a light source inside the first recess; and a light-reflective first member inside the second recess. In each of the light-emitting units, a center of the light-emitting unit and a center of the second recess coincide with an optical axis of the light source in a plan view. In at least one of the light-emitting units, a center of the first member is closer to a center of the light-emitting region than the optical axis of the light source is in a plan view.

20 Claims, 11 Drawing Sheets

(56) References Cited

FOREIGN PATENT DOCUMENTS

| JP | 2019530967 A | 10/2019 |
|----|--------------|---------|
| WO | 2018212436 A1 | 11/2018 |

* cited by examiner

LIGHT-EMITTING MODULE, SURFACE LIGHT SOURCE, AND LIQUID-CRYSTAL DISPLAY DEVICE

CROSS-REFERENCE TO RELATED PATENT APPLICATION

This is a continuation application of U.S. patent application Ser. No. 17/443,349, filed Jul. 26, 2021, which claims priority to Japanese Patent Application No. 2020-130780, filed on Jul. 31, 2020, the disclosures of which are hereby incorporated by reference in their entireties.

BACKGROUND OF THE INVENTION

1. Field of the Invention

The present disclosure relates to a light-emitting module, a surface light source, and a liquid-crystal display device.

2. Description of Related Art

Light-emitting modules including light-emitting elements such as light-emitting diodes are widely used for backlights for liquid-crystal display devices and various light sources for displays and the like.

An example of such a light-emitting module has a structure including a substrate on which a plurality of light-emitting elements are disposed, a plurality of luminous flux control members disposed on the substrate each of which corresponds to a respective one of the light-emitting elements to uniformly transmit light emitted from the light source upward, and a light shielding film positioned between the luminous flux control members to reflect at least a portion of light emitted through the luminous flux control members.

PCT Publication No. WO 2018/212436

SUMMARY OF THE INVENTION

An object of the present disclosure is to reduce darkening of the periphery of a light-emitting module in which a plurality of light-emitting units are two-dimensionally arranged.

A light-emitting module according to an embodiment of the present disclosure has a light-emitting region including a plurality of light-emitting units two-dimensionally arranged, the light-emitting units each including a light-guiding plate having a first main surface, a first recess opening toward the first main surface, a second main surface opposite to the first main surface, and a second recess opening toward the second main surface; a light source inside the first recess; and a light-reflective first member inside the second recess. In each of the light-emitting units, a center of the light-emitting unit and a center of the second recess coincide with an optical axis of the light source in a plan view. In at least one of the light-emitting units, a center of the first member is closer to a center of the light-emitting region than the optical axis of the light source is in a plan view.

Effects of the Invention

Certain embodiments in the present disclosure can reduce darkening of the periphery of a light-emitting module in which a plurality of light-emitting units are two-dimensionally arranged.

DETAILED DESCRIPTION OF EMBODIMENTS

Figure 1:
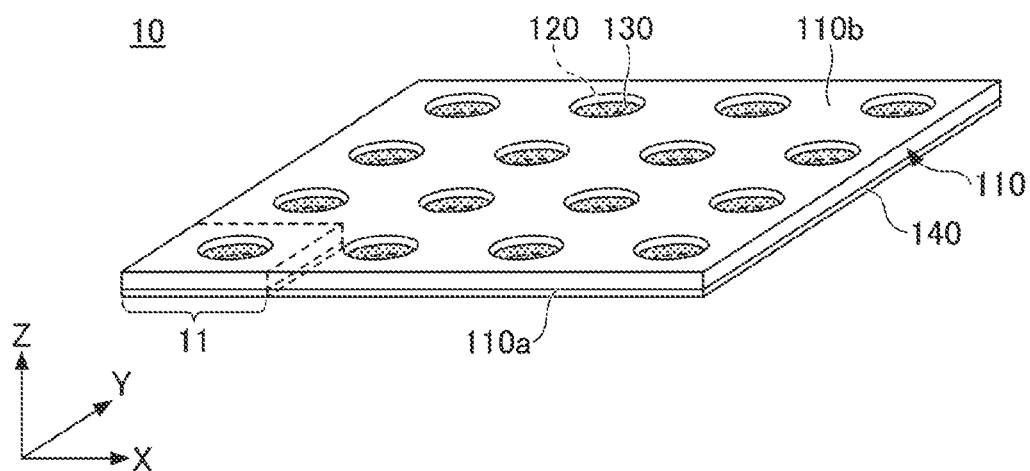
FIG. 1 is a schematic perspective view of an illustrative light-emitting module according to a first embodiment of the present disclosure.

Certain embodiments of the invention will be described below referring to the accompanying drawings. The description below includes terms indicating specific directions or positions (such as "up", "down", and other terms containing these terms) as appropriate. These terms are used to facilitate understanding of the invention referring to the drawings, and the meanings of these terms do not limit the technical scope of the present invention. A portion with the same reference numeral in a plurality of drawings represents the same or equivalent portion or member.

The term "parallel" as used in the present disclosure indicates that an angle between two straight lines, sides, or planes is in the range of about 0°±5° unless otherwise stated. The term "perpendicular" or "orthogonal" as used in the present disclosure indicates that an angle between two straight lines, sides, or planes is in the range of about 90°±5° unless otherwise stated.

In the embodiments described below, examples of light-emitting modules and the like are described to give a concrete form to the technical idea of the present invention, and the present invention is not limited to the description below. Unless otherwise specified, sizes, materials, shapes, and relative positions of constituent components described below are not intended to limit the scope of the present invention thereto, but rather are described as examples. Constitutions described in one embodiment may be applicable to other embodiments and modifications. Sizes or positional relationships of components illustrated in the drawings may be exaggerated in order to clarify the descriptions. In order to prevent the drawings from being too complicated, a schematic diagram in which illustration of components is partially omitted may be used, and an end view showing only a cut surface may be used as a cross-sectional view.

First Embodiment

Light-Emitting Module 10

Figure 2:
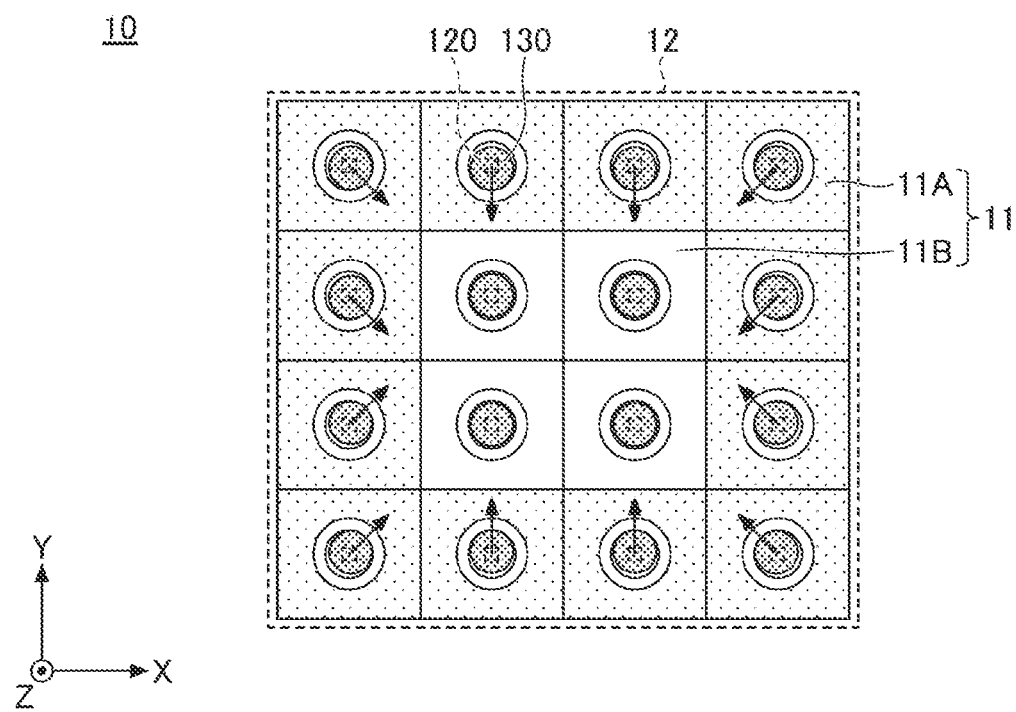
FIG. 2 is a schematic plan view of the illustrative light-emitting module according to the first embodiment.

FIG. 1 is a schematic perspective view of an illustrative light-emitting module according to a first embodiment. FIG. 2 is a schematic plan view of the illustrative light-emitting module according to the first embodiment.

A light-emitting module 10 has a light-emitting region 12 in which a plurality of light-emitting units 11 are two-dimensionally arranged as shown in FIG. 1 and FIG. 2. In an example shown in FIG. 1 and FIG. 2, 16 light-emitting units 11 are two-dimensionally arranged in a 4-by-4 matrix. This arrangement is not limiting as long as light-emitting units 11 are arranged in at least two rows and at least two columns in the light-emitting region 12. Each light-emitting unit 11 includes a light-guiding plate 110, a light source 120, and a light-reflective first member 130 located above the light source 120. Each light-emitting unit 11 may include a light-reflective second member 140 located below the light source 120.

The light-emitting region 12 is not one of regions in which individual light-emitting units 11 emit light but a region that emits light from the whole light-emitting units 11 configured to emit light at the same time, that is, the whole of a group of light-emitting units 11 that are connected in series or in parallel and cannot be operated individually. Adjacent ones of light-emitting units 11 located in a single light-emitting region to emit light at the same time may be integrated or separated from each other. In the case in which the light-emitting module includes a group of light-emitting units (group of light-emitting units) that can be operated separately from a plurality of light-emitting units 11 integrated, the light-emitting module has a plurality of light-emitting regions corresponding to a plurality of groups of light-emitting units.

The light-emitting units 11 include at least a first light-emitting unit 11A and may include a second light-emitting unit 11B as needed. That is, all the light-emitting units 11 may be first light-emitting units 11A. The first light-emitting units 11A may be located on the periphery of the light-emitting region 12, and at least one first light-emitting unit 11A may be disposed at a position other than the periphery of the light-emitting region 12. For example, the first light-emitting units 11A may occupy the whole of any one row or column on the periphery of the light-emitting region 12 or occupy the whole of any two rows or columns on the periphery of the light-emitting region 12. Alternatively, other arrangements may be employed. In the example shown in FIG. 2, the light-emitting units 11 include first light-emitting units 11A (12 first light-emitting units 11A indicated by the dot pattern in FIG. 2) located on the periphery of the light-emitting region 12 to form a frame and four second light-emitting units 11B that are not dotted and are located inside the first light-emitting units 11A. The difference between the first light-emitting units 11A and the second light-emitting units 11B is described below.

In the present embodiment, a single rectangular light-guiding plate 110 is provided for the whole light-emitting region 12. That is, the light-guiding plate 110 is a single light-guiding plate continuously formed across the light-emitting units 11 adjacent to each other in the present embodiment. The light-guiding plate 110 has a first main surface 110a and a second main surface 110b opposite to the first main surface 110a. The second main surface 110b of the light-guiding plate 110 serves as the emission surface of the light-emitting module 10.

In FIG. 1 and FIG. 2, the X direction, the Y direction, and the Z direction orthogonal to one another are defined for ease of description such that one and another sides orthogonal to each other of the rectangular light-guiding plate 110 lie along the X and Y directions and such that the thickness direction of the light-guiding plate 110 is the Z direction. Arrows indicating the X direction, the Y direction, and the Z direction are shown in some of the drawings hereinafter.

Figure 3:
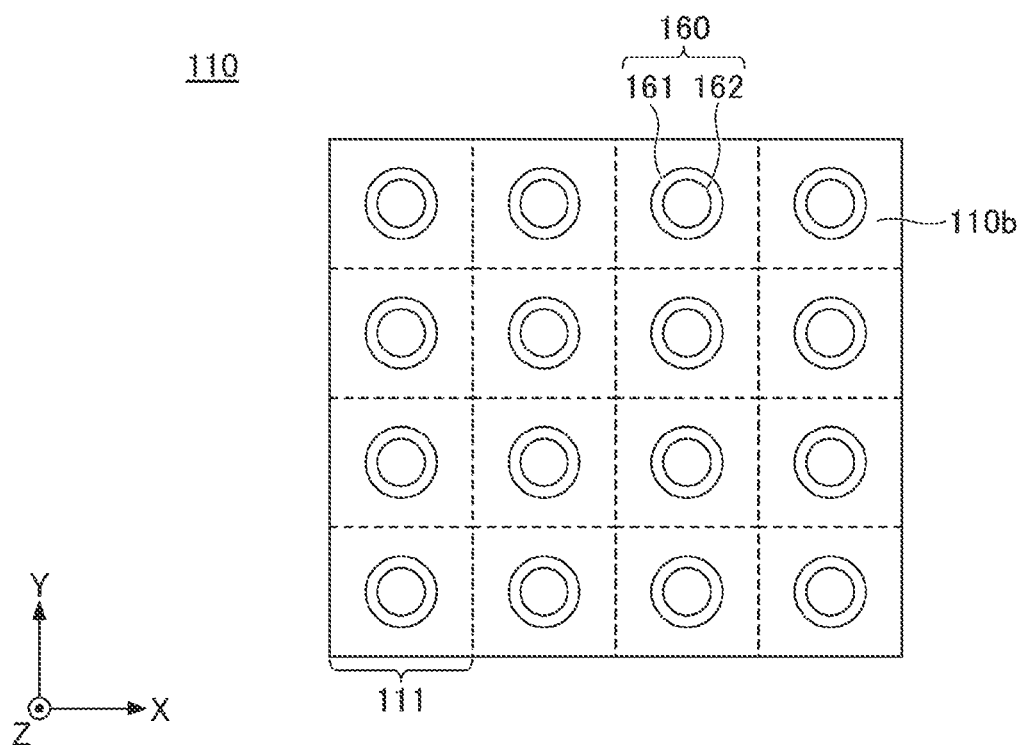
FIG. 3 is a schematic plan view of an illustrative light-guiding plate of the light-emitting module according to the first embodiment.
Figure 4:
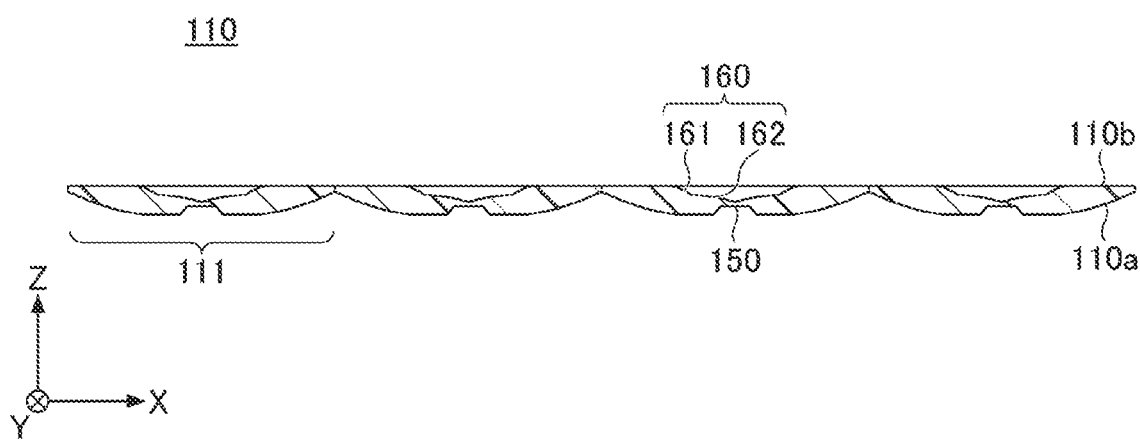
FIG. 4 is a schematic cross-sectional view of the illustrative light-guiding plate of the light-emitting module according to the first embodiment.

FIG. 3 is a schematic plan view of an illustrative light-guiding plate of the light-emitting module according to the first embodiment. FIG. 4 is a schematic cross-sectional view of the illustrative light-guiding plate of the light-emitting module according to the first embodiment. As shown in FIG. 3 and FIG. 4, the first main surface 110a and the second main surface 110b of the light-guiding plate 110 are divided into a plurality of unit regions 111 which are two-dimensionally arranged and each of which is correspond to a respective one of the light-emitting units 11.

Each unit region 111 of the light-guiding plate 110 has a first recess 150 opening toward the first main surface 110a and a second recess 160 opening toward the second main surface 110b. The first recess 150 and the second recess 160 overlap with each other in a plan view. In particular, the centers of the first recess 150 and the second recess 160 overlap with each other in a plan view. The second recess 160 is larger in size than the first recess 150 in a plan view. The term "plan view" refers to a view as seen in the normal direction (Z direction) to the second main surface 110b of the light-guiding plate 110. The shape as seen in the normal direction to the second main surface 110b of the light-guiding plate 110 may be referred to as a planar shape.

Figure 5:
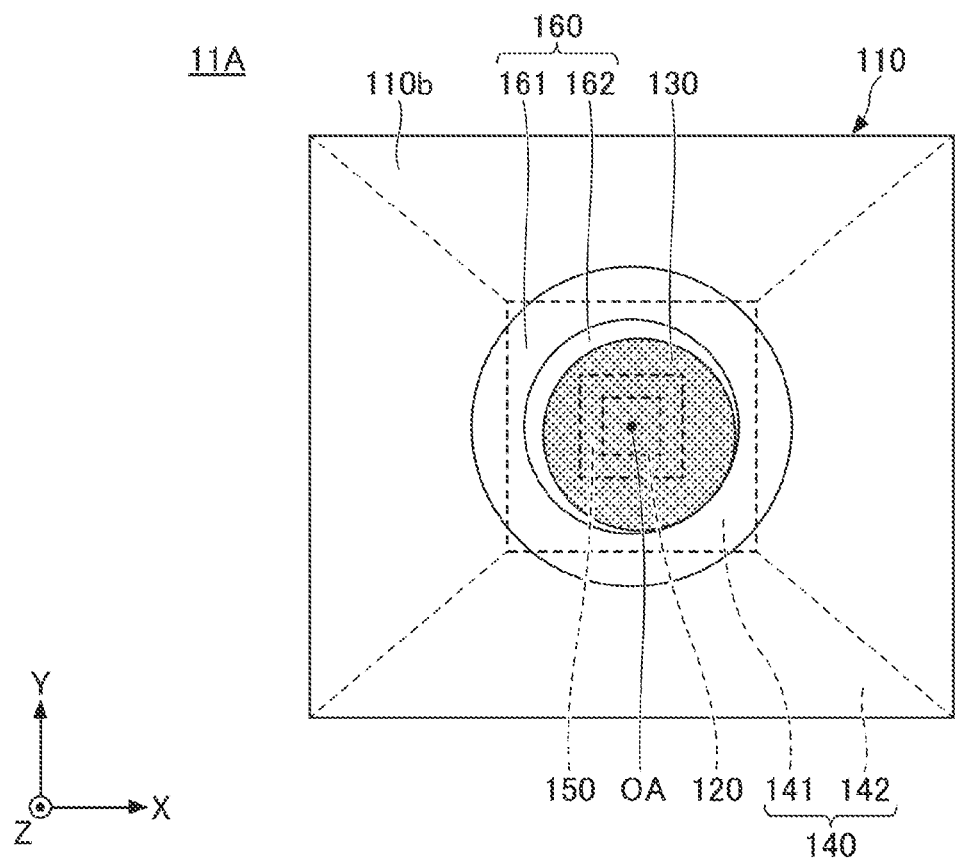
FIG. 5 is a first schematic plan view of an illustrative first light-emitting unit.
Figure 6:
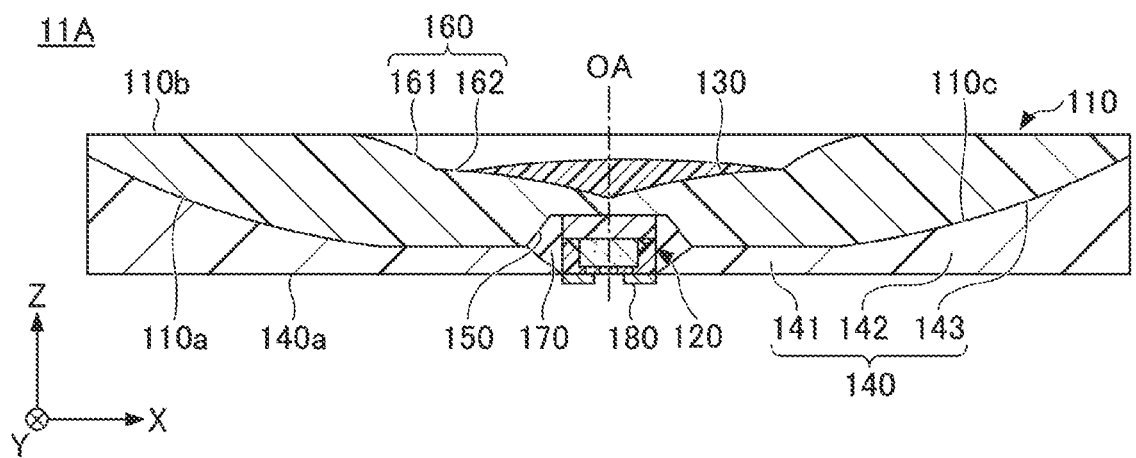
FIG. 6 is a first schematic cross-sectional view of the illustrative first light-emitting unit.
Figure 7:
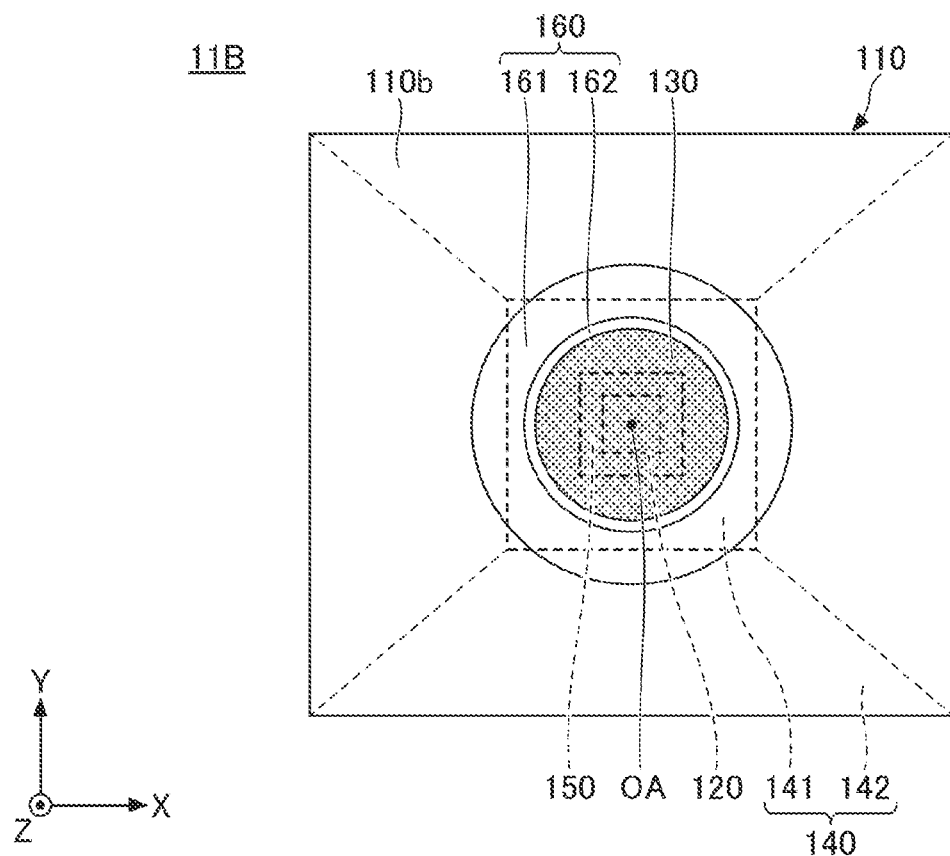
FIG. 7 is a schematic plan view of an illustrative second light-emitting unit.
Figure 8:
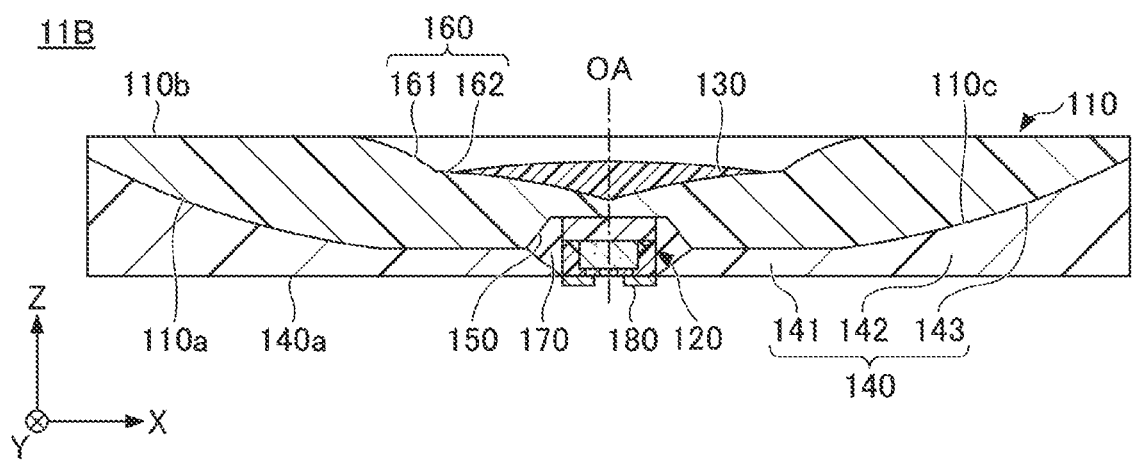
FIG. 8 is a schematic cross-sectional view of the illustrative second light-emitting unit.

FIG. 5 is a schematic plan view of an illustrative first light-emitting unit located at the upper left corner in FIG. 2. FIG. 6 is a schematic cross-sectional view of the illustrative first light-emitting unit located at the upper left corner in FIG. 2. FIG. 7 is a schematic plan view of an illustrative second light-emitting unit. FIG. 8 is a schematic cross-sectional view of the illustrative second light-emitting unit.

As shown in FIG. 5 to FIG. 8, the light source 120 is disposed in the first recess 150 at the first main surface 110a of the light-guiding plate 110 of each of the light-emitting units 11 (including both the first light-emitting units 11A and the second light-emitting units 11B). The first member 130 is disposed in the second recess 160 at the second main surface 110b of the light-guiding plate 110.

The light-guiding plate 110 has a light-guiding structure that emits, from the second main surface 110b, light emitted from the light sources 120 each of which is disposed inside a respective one of the first recesses 150. A portion of light emitted from the light source 120 propagates through the light-guiding plate 110 and enters the first member 130. The first member 130 moderately transmits light emitted upward from the light source 120 and diffuses the light downward and laterally. That is, the first member 130 prevents the region directly above the light source 120 from being too dark and from being too bright.

The second member 140 is disposed on the first main surface 110a of the light-guiding plate 110 as needed. The second member 140 reflects light emitted from the light source 120. For example, the second member 140 in the present embodiment includes a base 141 and a continuous wall portion 142 around the base 141. The base 141 is disposed on a flat portion of the first main surface 110a of the light-guiding plate 110 around the first recess 150. The wall portion 142 is disposed on a recessed portion of the first main surface 110a of the light-guiding plate 110 around the flat portion. The base 141 and the wall portion 142 can be integrated to constitute the single continuous second member 140. Alternatively, the base 141 and the wall portion 142 can be constituted as separate bodies and combined into the second member 140. In the case in which the base 141 and the wall portion 142 are constituted as separate bodies, a lower region (that is, a portion with the same thickness as the base 141) of the wall portion 142 and an upper region (a portion above the upper surface of the base 141) above the base 141 out of the wall portion 142 can be constituted as separate bodies. In this case, the lower region of the wall portion 142 and the base 141 may be integrally formed.

The planar shape of the base 141 is, for example, a rectangular shape. The planar shape of the base 141 may be another shape such as a circular shape or an elliptic shape. For example, the wall portion 142 rises from the first main surface 110a toward the second main surface 110b of the light-guiding plate 110. In other words, the wall portion 142 is a projection located above the upper surface of the base 141 in a cross-sectional view. The wall portion 142 has an inclined surface 143 surrounding the light source 120 in a plan view. A single second member 140 may be provided for the whole light-emitting region 12. That is, the second member 140 may be continuously formed across the light-emitting units 11 adjacent to each other.

As shown in FIG. 5 to FIG. 8, in each of the light-emitting units 11 (including both the first light-emitting units 11A and the second light-emitting units 11B), the center of the light-emitting unit and the center of the second recess 160 coincide with an optical axis OA of the light source 120 in a plan view. On the contrary, as shown in FIG. 5 and FIG. 6, the center of the first member 130 of the first light-emitting unit 11A is located closer to the center of the light-emitting region 12 than the optical axis OA of the light source 120 is in a plan view. On the other hand, as shown in FIG. 7 and FIG. 8, the center of the first member 130 of the second light-emitting unit 11B coincides with the optical axis OA of the light source 120 in a plan view.

The optical axis OA of the light source 120 is defined as a line passing through the center of the light source 120 and intersecting with a plane parallel to the second main surface 110b of the light-guiding plate 110 at right angles as shown in FIG. 6 and other drawings. The statement "the center of another member coincides with the optical axis OA of the light source 120" as used herein indicates that the amount of deviation of the center of the other member from the optical axis OA of the light source 120 is 0.05 mm or less in a plan view.

The statement "the center of the first member 130 is located closer to the light-emitting region 12 than the optical axis OA of the light source 120 is in a plan view" as used herein indicates that, supposing there are a first straight line connecting the optical axis OA of the light source 120 and the center of the light-emitting region 12 and a second straight line passing through the optical axis OA of the light source 120 and perpendicular to the first straight line in a plan view in each light-emitting unit 11 in which the center of the first member 130 does not coincide with the optical axis OA of the light source 120, the area of a portion of the first member 130 on the side of the center of the light-emitting region 12 with respect to the second straight line is greater than the area of the light-reflective member opposite to the center of the light-guiding plate across the second straight line.

As described above, the first light-emitting units 11A differ from the second light-emitting units 11B in the position of the center of the first member 130 relative to the optical axis OA of the light source 120. This allows for obtaining the first light-emitting units 11A and the second light-emitting units 11B with different light distribution characteristics. Each first light-emitting unit 11A has an asymmetric light distribution characteristic with respect to the optical axis OA of the light source 120, and each second light-emitting unit 11B has a symmetric light distribution characteristic with respect to the optical axis OA of the light source 120.

Specifically, the center of the first member 130 of the first light-emitting unit 11A is located closer to the center of the light-emitting region 12 than the optical axis OA of the light source 120 is in a plan view. Accordingly, the proportion of a portion of light reflected from the interface between the light-guiding plate 110 and the first member 130, the portion diffused in the in-plane direction of the light-guiding plate 110, can be increased on the side farther from the center of the light-emitting region 12 compared with the side closer to the center of the light-emitting region 12.

In the case in which all light-emitting units each have a symmetric light distribution characteristic about the optical axis of the light source in a light-emitting module having a light-emitting region in which the light-emitting units are two-dimensionally arranged, the periphery of the light-emitting region may become dark to form a dark line. However, in the light-emitting module 10, with the first light-emitting units 11A having the above light distribution characteristics, light on the peripheral side of the light-emitting region 12 can be increased, which can reduce darkening of the periphery, so that luminance non-uniformity on the peripheral side of the light-emitting region 12 can be reduced.

The structures of the first light-emitting unit 11A and the second light-emitting unit 11B are described below in detail.
Light-Guiding Plate 110

The light-guiding plate 110 has a light-guiding structure in which light emitted from the light source 120 is emitted from the second main surface 110b as uniformly as possible. For example, the first recess 150 at the first main surface 110a of the light-guiding plate 110 has the shape of a frustum of a quadrangular pyramid in which the upper surface is smaller than the bottom surface, and the upper surface of the frustum of a quadrangular pyramid defines the bottom of the first recess 150. In the present embodiment, the frustum of a quadrangular pyramid is arranged such that the four sides of each of the upper and bottom surfaces are parallel to the four sides of the unit region 111. However, the frustum of a quadrangular pyramid may be arranged such that the diagonals of the upper and bottom surfaces are parallel to the four sides of the unit region 111.

The first main surface 110$a$ of the light-guiding plate 110 can include a flat portion parallel to the XY plane in the region other than the first recess 150 in which the light source is disposed. The first main surface 110$a$ of the light-guiding plate 110 can also include a surface inclined with respect to the XY plane in the region other than the first recess 150. Further, the first main surface 110$a$ of the light-guiding plate 110 can include, in the region other than the first recess 150, for example, a flat portion around the first recess 150 and an inclined surface inclined with respect to the XY plane in a cross-sectional view around the flat portion as shown in FIG. 6. The inclined surface can reflect light traveling toward the first main surface 110$a$. For example, the inclined surface may include a curved portion 110$c$ that is entirely or partially curved in a cross-sectional view as shown in FIG. 6. For example, the curved portion 110$c$ lies in a region extending from the vicinity of the first recess 150 to the periphery of each unit region 111 of the first main surface 110$a$. With the second member 140 disposed on the first main surface 110$a$, the curved portion 110$c$ reflects, toward the second main surface 110$b$, light incident on the first main surface 110$a$ at a shallow angle, so that the light extraction efficiency is enhanced.

The second main surface 110$b$ of the light-guiding plate 110 can include a flat portion parallel to the XY plane in the region other than the second recess 160 in which the first member 130 is disposed. The second recess 160 controls the direction of emission of light by refraction of light at the boundary between the inside of the light-guiding plate 110 and the external environment. For example, the second recess 160 can include an upper recess 161 closer to the flat portion of the second main surface 110$b$ in a cross-sectional view and a lower recess 162 that is closer to the first main surface 110$a$ than the upper recess 161 is and has an inclination angle of a lateral surface different from the inclination angle of the lateral surface of the upper recess 161 in a cross-sectional view. For example, the upper recess 161 has the shape of a truncated cone, and the lower recess 162 has a conical shape. In this case, the upper surface of the truncated conical upper recess 161 is in contact with the bottom surface of the conical lower recess 162. This constitution is not limiting, and the upper recess 161 and the lower recess 162 may both have the shape of, for example, a truncated cone. The second recess 160 is not limited to the two-tier structure including the upper recess 161 and the lower recess 162 but may have a structure including only a single recess or a structure including recesses constituting three or more tiers. The deepest portion of the second recess 160 is preferably located at the center in a plan view. The opening of the second recess 160 preferably has a symmetric shape having two-fold or four-fold rotational symmetry or the like. Further, the lateral surface of the second recess 160 preferably has line symmetry about a section including the central axis passing through the center of the second recess 160.

Figure 9:
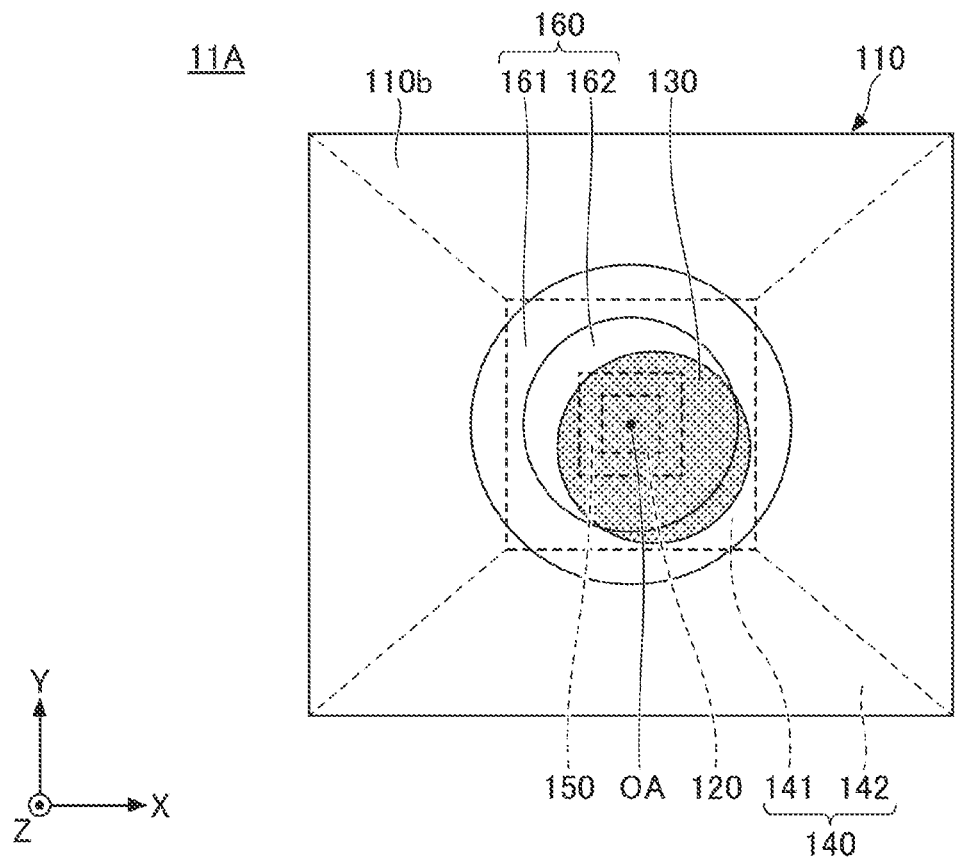
FIG. 9 is a second schematic plan view of another illustrative first light-emitting unit.
Figure 10:
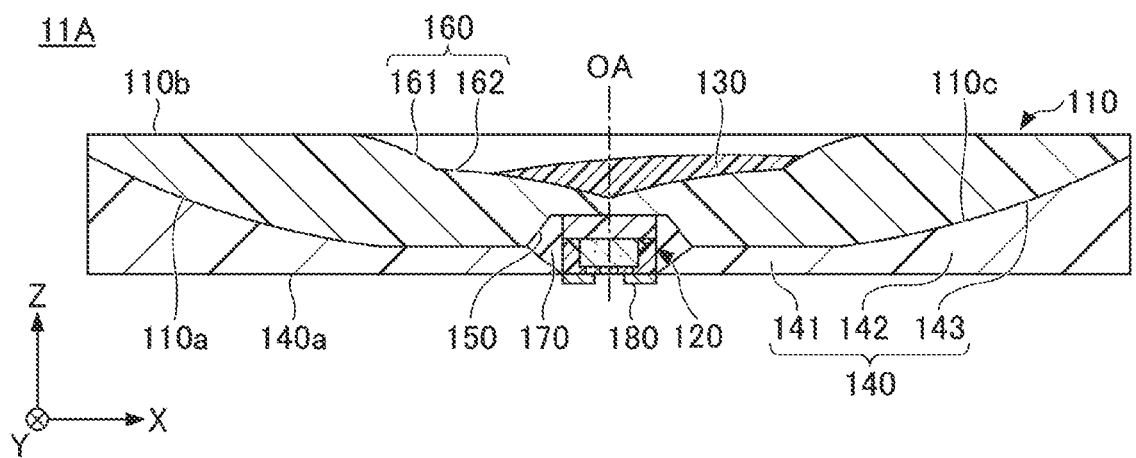
FIG. 10 is a second schematic cross-sectional view of the other illustrative first light-emitting unit.

The first member 130 is disposed in the second recess 160. For example, the first member 130 is preferably located away from the upper end of the second recess 160 as shown in FIG. 5 to FIG. 8. Alternatively, the first member 130 may extend from the second recess 160 onto the flat portion of the second main surface 110 in addition to the second recess 160. In the case in which the second recess 160 has the two-tier structure including the upper recess 161 and the lower recess 162, the first member 130 may be disposed only in the lower recess 162. Alternatively, the first member 130 may be located in the lower recess 162 and extend from the lower recess 162 to the lateral surface of the upper recess 161 located closer to the center of the light-emitting region 12 than the optical axis OA of the light source 120 is in a plan view as shown in FIG. 9 and FIG. 10. In the case shown in FIG. 9 and FIG. 10, the center of the first member 130 can be deviated more greatly toward the center of the light-emitting region 12 from the optical axis OA of the light source 120 than in the case shown in FIG. 5 and FIG. 6, so that light can be further increased on the side farther from the center of the light-emitting region 12.

Examples of a material of the light-guiding plate 110 include thermoplastic resins such as acrylic resins, polycarbonate resins, cyclic polyolefin resins, poly(ethylene terephthalate) resins, and polyester resins, thermosetting resins such as epoxy resins and silicone resins, and light-transmissive materials such as glass. For example, a light-guiding plate in which a plurality of light-guiding plates 110 are two-dimensionally connected can be formed by injection molding using a metal mold having a shape corresponding to the first recess 150, the curved portion 110$c$, and the second recess 160.

In the present embodiment, the center of the first recess 150 preferably coincides with the center of the second recess 160 in a plan view. By the molding method using the metal mold having projections corresponding to the first recess 150 and the second recess 160 inside the cavity, the center of the first recess 150 of each light-emitting unit 11 is comparatively easily allowed to coincide with the center of the second recess 160.

Light Source 120

The light source includes a semiconductor light-emitting element. A semiconductor light-emitting element can be used alone for the light source.

Figure 11:
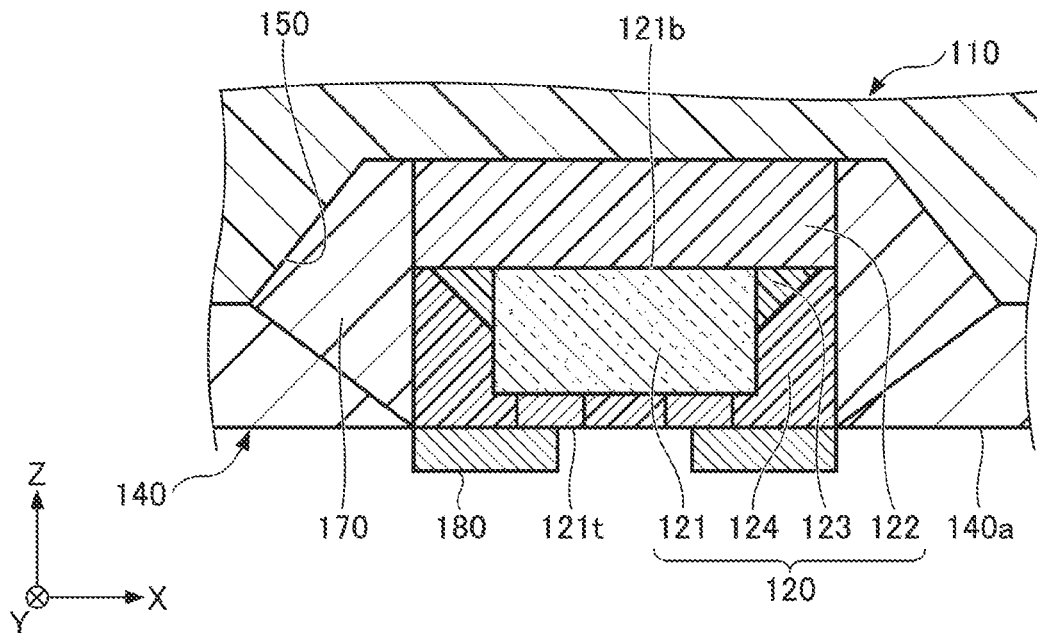
FIG. 11 is a schematic cross-sectional view of an illustrative light source of the light-emitting module according to the first embodiment.

Alternatively, a light-emitting device including a semiconductor light-emitting element and other members can be used for the light source. FIG. 11 is a schematic enlarged view of a portion including the light source of the light-emitting module according to the first embodiment and shows a schematic cross-sectional view of an illustrative light source. In the example shown in FIG. 11, a light-emitting device including a light-emitting element 121, a wavelength conversion member 122, a bonding member 123, and a light-reflective member 124 is shown as the light source 120.

A typical example of the light-emitting element 121 is a light-emitting diode (LED). For example, the light-emitting element 121 includes a sapphire or gallium nitride element substrate and a semiconductor layered body. The semiconductor layered body includes an n-type semiconductor layer, a p-type semiconductor layer, an active layer between these layers, and electrodes 121$t$ electrically connected to the n-type semiconductor layer and the p-type semiconductor layer. The semiconductor layered body may contain a nitride semiconductor ($In_XAl_YGa_{1-X-Y}N$, where $0 \leq X$, $0 \leq Y$, and $X+Y \leq 1$) that can emit light in the ultraviolet to visible range.

The semiconductor layered body can include at least one light-emitting layer that can emit light in the ultraviolet to visible range as described above. For example, the semiconductor layered body can include a light-emitting layer that can emit light with a single emission color or emission wavelength between the n-type semiconductor layer and the p-type semiconductor layer. The light-emitting layer may have a structure with a single active layer, such as a double heterojunction and a single quantum well (SQW) structure, or a structure with a group of active layers, such as a multiple quantum well (MQW) structure. The semiconductor layered body can include a plurality of light-emitting layers. For example, the semiconductor layered body may include a plurality of light-emitting layers between the n-type semiconductor layer and the p-type semiconductor layer or may include a repetitive structure including the n-type semiconductor layer, the light-emitting layer, and the p-type semiconductor layer in order. The light-emitting layers may include active layers configured to emit light with different emission colors or emission wavelengths or may include active layers configured to emit light with the same emission color or emission wavelength. The term "emission colors" as used herein refers to emission colors that can be regarded as the same emission color at the time of use, and, for example, variations in dominant wavelength of about some nanometers are acceptable. The combination of the emission colors or the emission wavelengths can be appropriately selected. For example, in the case in which the semiconductor layered body includes two active layers, examples of the combination of emission colors include blue and blue, green and green, red and red, ultraviolet and ultraviolet, blue and green, blue and red, and green and red.

The light-emitting elements 121 of a plurality of light-emitting units 11 may include light-emitting elements that emit light with different colors or wavelengths. For example, the light-emitting elements 121 of the light-emitting units 11 may include a light-emitting element that emits red light, a light-emitting element that emits blue light, and a light-emitting element that emits green light. In the present embodiment, a light-emitting device (LED) including a light-emitting element 121 that emits blue light as the light-emitting element 121 is described as an example.

The light-emitting element 121 typically has a rectangular shape in a plan view. The length of a side of the rectangular shape of the light-emitting element 121 is, for example, 1,000 µm or less. The length and width dimensions of the rectangular shape of the light-emitting element 121 may be 500 µm or less. Light-emitting elements having length and width dimensions of 500 µm or less are available at low prices. Alternatively, the length and width dimensions of the rectangular shape of the light-emitting element 121 may be 200 µm or less. It is advantageous that the length of a side of the rectangular shape of the light-emitting element 121 be small in terms of expression of high-definition images, local dimming, and the like in the case of application to a backlight unit of a liquid-crystal display device.

Figure 17:
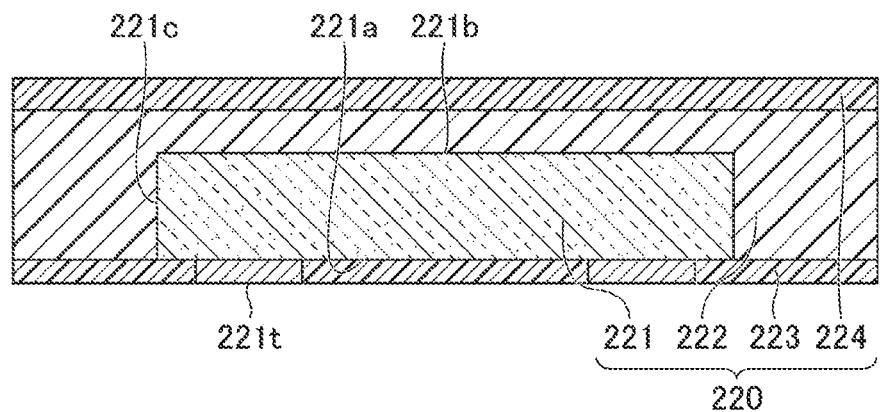
FIG. 17 is a schematic cross-sectional view of an illustrative light source of the light-emitting module according to the second embodiment.

In particular, a light-emitting element having length and width dimensions that are both 250 µm or less has a smaller area of the upper surface relative to the lateral surfaces, and the amount of light emitted from the lateral surfaces of the light-emitting element therefore becomes relatively large. Accordingly, a batwing light distribution characteristic is likely to be obtained. In a broad sense, the expression "batwing light distribution characteristic" as used herein refers to a light distribution characteristic defined by such an emission intensity distribution in which the emission intensity is high in directions at larger angles in absolute value than at 0°, which is the direction of the optical axis perpendicular to the upper surface of the light-emitting element. Such a light-emitting element is particularly useful in the case in which a light-emitting element alone or a light source 220 as shown in FIG. 17 is used for the light source.

The wavelength conversion member 122 is disposed on an exit surface 121b of the light-emitting element 121. The wavelength conversion member 122 absorbs at least a portion of light emitted from the light-emitting element 121 and emits light with a wavelength different from the wavelength of the light emitted from the light-emitting element 121. For example, the wavelength conversion member 122 converts a portion of blue light emitted from the light-emitting element 121 and emits yellow light. This structure allows for obtaining white light as a mixture of blue light that has passed through the wavelength conversion member 122 and yellow light emitted from the wavelength conversion member 122.

In the case in which a light-emitting device including a wavelength conversion member is used for the light source, light emitted from the light-emitting element 121 is generally introduced into the light-guiding plate 110 through the wavelength conversion member 122. Accordingly, light after the color mixture is diffused inside the light-guiding plate, so that light such as white light with reduced luminance non-uniformity can be extracted from the second main surface 110b of the light-guiding plate 110. In this respect, use of the light-emitting device for the light source 120 in the present embodiment is more advantageous in order to make the light uniform than in the case in which light is subjected to wavelength conversion after being diffused into the light-guiding plate.

The wavelength conversion member 122 is typically a member in which phosphor particles are dispersed in light-transmissive resin or glass serving as the base material. For the resin in which the particles of the phosphor or the like are to be dispersed, a silicone resin, a modified silicone resin, an epoxy resin, a modified epoxy resin, a urea resin, a phenolic resin, an acrylic resin, a urethane resin, a fluorocarbon resin, or a resin containing two or more of these resins can be used.

In view of efficiently introducing light into the light-guiding plate 110, it is beneficial that the base material of the wavelength conversion member 122 have a refractive index lower than the refractive index of the material of the light-guiding plate 110. A material with a refractive index different from the refractive index of the base material may be dispersed into the material of the wavelength conversion member 122 to allow the wavelength conversion member 122 to diffuse light. For example, particles of titanium dioxide or silicon oxide may be dispersed into the base material of the wavelength conversion member 122.

A known material can be used for the phosphor. Examples of the phosphor include fluoride phosphors such as KSF phosphors, nitride phosphors such as CASN, YAG phosphors, and β-SiAlON phosphors. YAG phosphors are examples of a wavelength conversion substance that converts blue light into yellow light, KSF phosphors and CASN are examples of a wavelength conversion substance that converts blue light into red light, and β-SiAlON phosphors are examples of a wavelength conversion substance that converts blue light into green light. The phosphor may be a quantum-dot phosphor.

It is preferable that the same phosphor be contained in the wavelength conversion members 122 of a plurality of light-emitting modules 10. Alternatively, different phosphors can be dispersed in the base materials of the wavelength conversion members 122 of a plurality of light-emitting modules 10.

The bonding member 123 is a light-transmissive member covering at least a portion of the lateral surfaces of the light-emitting element 121 and a portion of the surface of the wavelength conversion member 122 facing the light-emitting element 121 and bonds the wavelength conversion member 122 to the light-emitting element 121. The bonding member 123 may also be located between the light-emitting element 121 and the wavelength conversion member 122, which is not shown in FIG. 11.

For the material of the bonding member 123, a resin composition containing a transparent resin material as the base material can be used. For example, the bonding member 123 has a transmittance of light at the peak emission wavelength of the light-emitting element 121 of 60% or more. In view of effective use of light, it is beneficial that the transmittance of the bonding member 123 at the peak emission wavelength of the light-emitting element 121 be 70% or more, and it is more beneficial that the transmittance be 80% or more.

Typical examples of the base material of the bonding member 123 include thermosetting resins such as epoxy resins and silicone resins. For the base material of the bonding member 123, a silicone resin, a modified silicone resin, an epoxy resin, a phenolic resin, a polycarbonate resin, an acrylic resin, a polymethylpentene resin, a polynorbornene resin, or a material containing two or more of these resins may be used. The bonding member 123 typically has a refractive index lower than the refractive index of the light-guiding plate 110. The bonding member 123 may have a light-diffusing function because of, for example, dispersion of a material having a refractive index different from the refractive index of the base material.

As described above, the bonding member 123 covers at least a portion of the lateral surfaces of the light-emitting element 121. The bonding member 123 has an outer surface that is the interface with the light-reflective member 124 described below. Light that has been emitted from the lateral surfaces of the light-emitting element 121 and entered the bonding member 123 is reflected at a position of the outer surface of the bonding member 123 toward a region above the light-emitting element 121. The shape of the outer surface of the bonding member 123 in a cross-sectional view is not limited to a straight line as shown in FIG. 11 but may be a shape constituted of lines, a curved line convex toward the light-emitting element 121, or a curved line convex away from the light-emitting element 121.

The light-reflective member 124 reflects light and covers the light-emitting element 121 and the bonding member 123. The light-reflective member 124 is also located on the surface of the light-emitting element 121 provided with the electrodes 121t, and the electrodes 121t are exposed from the light-reflective member 124. For the material of the light-reflective member 124, for example, a material of the same kind as the material of the second member 140 can be used. For example, the light-reflective member 124 and the second member 140 may be formed of the same material. With the light-reflective member 124 covering the region of the lower surface of the light-emitting element 121 except for the electrodes 121t, leakage of light toward the first main surface 110a of the light-guiding plate 110 can be reduced.

For example, the light source 120 is obtained by two-dimensionally arranging and bonding a plurality of light-emitting elements 121 on the sheet-shaped wavelength conversion member 122 using the bonding members 123, filling the gaps between the light-emitting elements 121 with the light-reflective member 124, and performing singulation.

First Member 130

The first member 130 is disposed in the second recess 160 of the light-guiding plate 110. The first member 130 disposed above the light source 120 can reflect toward the first main surface 110a a portion of light emitted from the light source.

In the case in which the second recess 160 has a shape having an inclined surface, such as a cone, a pyramid, and a frustum of a cone or pyramid, light reflected from the interface between the light-guiding plate 110 and the first member 130 is diffused into a broader region in the light-guiding plate 110 and travels toward the first main surface 110a. Accordingly, light emitted from the light source 120 can be more efficiently diffused in the plane of the light-guiding plate 110.

Further, with the first member 130 facing the light source 120, the luminance directly above the light source 120 is inhibited from being greatly high compared with other regions of the second main surface 110b of the light-guiding plate 110. In the case in which the first member 130 is selectively formed inside the lower recess 162 of the second recess 160, the luminance directly above the light source 120 is prevented from more greatly decreasing than necessary. Accordingly, more uniform light can be obtained while the overall thickness of the light-emitting unit 11 is reduced.

The first member 130 is formed of, for example, a light-reflective material such as a resin material in which a light-reflective filler is dispersed. The term "reflective" or "light-reflective" as used in the present specification indicates that the reflectance at the peak emission wavelength of the light source 120 is 60% or more. It is more beneficial that the reflectance of the first member 130 at the peak emission wavelength of the light source 120 be 70% or more, and it is further beneficial that the reflectance be 80% or more.

For the base material of the resin material used for forming the first member 130, a silicone resin, a phenolic resin, an epoxy resin, a BT resin, polyphthalamide (PPA), or the like can be used. For the light-reflective filler, metal particles or particles of an inorganic or organic material having a refractive index higher than the refractive index of the base material can be used.

Examples of the light-reflective filler include particles of titanium dioxide, silicon oxide, zirconium dioxide, potassium titanate, aluminum oxide, aluminum nitride, boron nitride, mullite, niobium oxide, or barium sulfate and particles of a rare-earth oxide such as yttrium oxide and gadolinium oxide. It is beneficial that the first member 130 be white in color.

The distribution of the light-reflective filler in the first member 130 may be substantially even or uneven inside the first member 130, or there may be a gradient. For example, the distribution of the light-reflective filler in the first member 130 can be uneven due to sedimentation or separation from the base material of the filler before the base material is cured in a step of forming the first member 130.

It is beneficial that the number density of the filler defined by the number of particles of the filler per unit area in a plan view be high near the center compared with the number density near the outer edge of the first member 130 because the luminance in the region directly above the light source 120 is easily inhibited from being locally and excessively high.

Second Member 140

The second member 140 covers the first main surface 110a of the light-guiding plate 110. The second member 140 may cover the light source 120 disposed inside the first recess 150 at the first main surface 110a. In the case in which a light-transmissive member 170 covering the light source is further disposed in the first recess 150, the second member 140 may cover a portion or the whole of the light-transmissive member 170. The second member 140 can be formed of, for example, a material described as an example of the material of the first member 130. With the second member 140 covering the first main surface 110a, light incident on the first main surface 110a of the light-guiding plate 110 can be reflected toward the second main surface 110b.

Light-transmissive Member 170

The light source 120 is bonded to the first recess 150 of the light-guiding plate 110 with the light-transmissive member 170. The light-transmissive member 170 is at least partially located inside the first recess 150. The light-transmissive member 170 may include a portion located between the bottom of the first recess 150 and the wavelength conversion member 122. The light-transmissive member 170 may include a portion extending below (on the side opposite to the second main surface 110b of the light-guiding plate 110) the first main surface 110a of the light-guiding plate 110.

The light-transmissive member 170 is formed of a resin composition containing a transparent resin material as the base material. For example, the light-transmissive member 170 has a transmittance of light at the peak emission wavelength of the light-emitting element 121 of 60% or more. In view of effective use of light, it is beneficial that the transmittance of the light-transmissive member 170 at the peak emission wavelength of the light-emitting element 121 be 70% or more, and it is more beneficial that the transmittance be 80% or more.

Typical examples of the base material of the light-transmissive member 170 include thermosetting resins such as epoxy resins and silicone resins. For the base material of the light-transmissive member 170, a silicone resin, a modified silicone resin, an epoxy resin, a phenolic resin, a polycarbonate resin, an acrylic resin, a polymethylpentene resin, a polynorbornene resin, or a material containing two or more of these resins may be used. The light-transmissive member 170 typically has a refractive index lower than the refractive index of the light-guiding plate 110. The light-transmissive member 170 may have a light-diffusing function because of, for example, dispersion of a material having a refractive index different from the refractive index of the base material.

Wiring Layer 180

A wiring layer 180 is located on a first main surface 140a, which corresponds to the lower surface of the light-emitting unit 11, of the second member 140 and electrically connected to the electrodes 121t of the light-emitting element 121. The wiring layer 180 on the first main surface 140a of the second member 140 of the light-emitting module 10 electrically connects the electrodes 121t of the light-emitting elements 121 of the light-emitting units 11.

The circuit constituted of the wiring layer 180 is determined according to the driving method of each light-emitting unit 11 of the light-emitting module 10. For example, in the case in which the light-emitting units 11 of the light-emitting module 10 are driven with the same timing, eight series circuits each including two, which are connected in series, of the light sources 120 of the light-emitting units 11 arranged in a four-by-four matrix may be connected in parallel.

Alternatively, the light sources 120 of the light-emitting units 11 arranged in a four-by-four matrix may be divided into two or more groups (groups of light-emitting units), and the circuit may be constituted such that each group is driven at the same time. The wiring layer 180 can be typically constituted of a single-layer film or a layered film formed of metal such as Cu.

Method of Manufacturing Light-emitting Module 10

The light-emitting module 10 can be manufactured by, for example, the method described below. The light-guiding plate 110 having the first recess 150 and the second recess 160 in each unit region 111 is first provided.

Subsequently, an uncured material of the light-transmissive member 170 is disposed in the first recess 150 of the light-guiding plate 110 using a dispenser or the like. The light source 120 is disposed in the first recess 150, and the uncured material of the light-transmissive member 170 is cured. At this time, the light source 120 is disposed in the first recess 150 such that the center of the first recess 150 coincides with the optical axis OA of the light source 120.

Subsequently, a resin material or the like in which a light-reflective filler has been dispersed is applied to the first main surface 110a of the light-guiding plate 110, and the resin material is cured. Further, the light-reflective resin layer obtained by curing the resin material is removed until the electrodes 121t of the light source 120 are exposed. This allows the second member 140 covering the first main surface 110a of the light-guiding plate 110 to be formed.

After that, the wiring layer 180 is formed on the second member 140. The first member 130 is also formed in the second recess 160 at the second main surface of the light-guiding plate 110 by, for example, potting or inkjet printing. At this time, the first member 130 is formed such that the center of the first member 130 of the first light-emitting unit 11A is located closer to the center of the light-emitting region 12 than the optical axis OA of the light source 120 is in a plan view. On the other hand, the first member 130 is formed such that the center of the first member 130 of the second light-emitting unit 11B coincides with the optical axis OA of the light source 120 in a plan view. This allows for obtaining the light-emitting module 10 including the first light-emitting units 11A and the second light-emitting units 11B.

First Modification of First Embodiment

An example of a light-emitting module that differs from that in the first embodiment in the arrangement of the first light-emitting units 11A is described as a first modification of the first embodiment. In the first modification of the first embodiment, repeated description of the same components as in the embodiment described above may be omitted.

Figure 12:
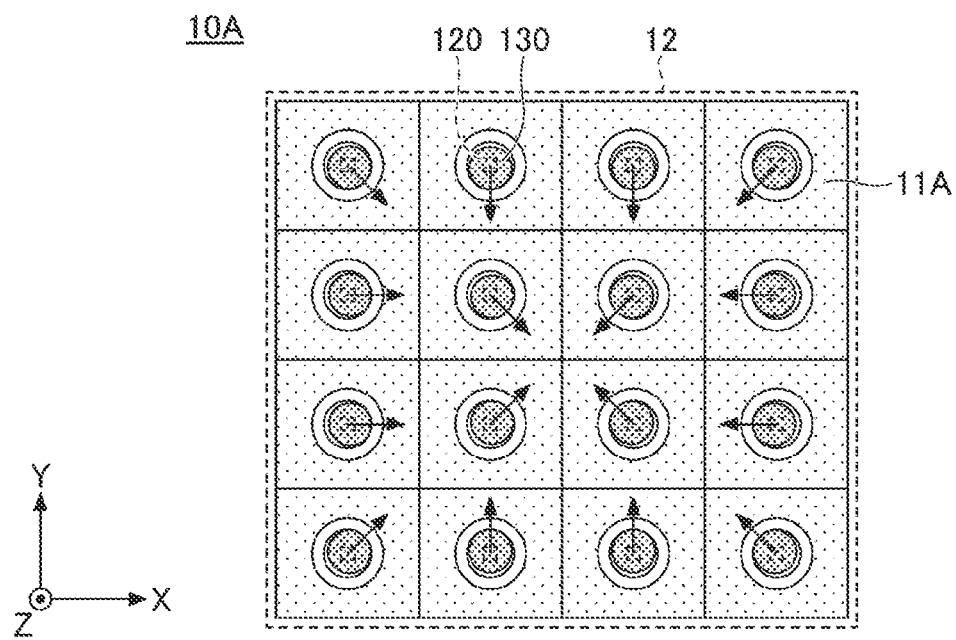
FIG. 12 is a schematic plan view of an illustrative light-emitting module according to a first modification of the first embodiment.

FIG. 12 is a schematic plan view of the illustrative light-emitting module according to the first modification of the first embodiment. In a light-emitting module 10A shown in FIG. 12, all light-emitting units are first light-emitting units 11A. That is, the center of the first member 130 of every light-emitting unit is located closer to the center of the light-emitting region 12 than the optical axis OA of the light source 120 is in a plan view.

In each of the eight first light-emitting units 11A disposed on the diagonals among the 16 first light-emitting units 11A arranged in a 4-by-4 matrix in the quadrangular light-emitting region 12 in a plan view, the center of the first member 130 is deviated in a direction substantially parallel to one of the diagonals from the optical axis OA of the light source 120 toward the center of the light-emitting region 12 as indicated by the arrow. The center of the first member 130 of each of the other eight first light-emitting units 11A is deviated in a direction substantially parallel to the X direction or the Y direction from the optical axis OA of the light source 120 toward the center of the light-emitting region 12 as indicated by the arrow.

In the light-emitting module 10A in which all light-emitting units are first light-emitting units 11A, the proportion of a portion of light reflected from the interface between the light-guiding plate 110 and the first member 130, the portion diffused in the in-plane direction of the light-guiding plate 110, can be further increased on the side farther from the center of the light-emitting region 12 compared with the side closer to the center of the light-emitting region 12. Accordingly, darkening of the periphery can be further reduced by further increasing light on the peripheral side of the light-emitting region 12, so that luminance non-uniformity on the peripheral side of the light-emitting region 12 can be further reduced.

Figure 13:
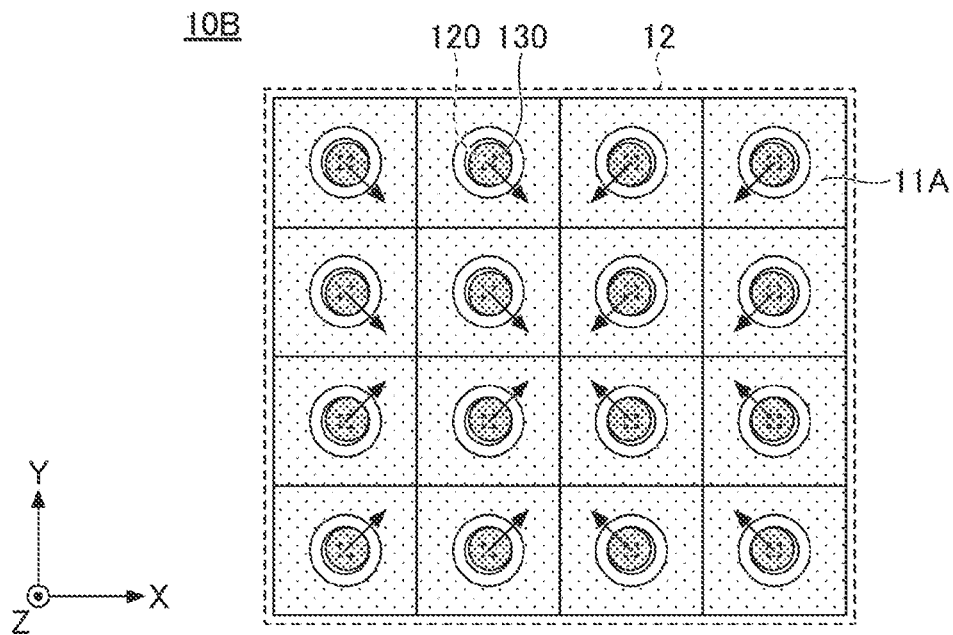
FIG. 13 is a schematic plan view of an illustrative light-emitting module according to a second modification of the first embodiment.

FIG. 13 is a schematic plan view of an illustrative light-emitting module according to a second modification of the first embodiment. Similarly to the light-emitting module 10A, in a light-emitting module 10B shown in FIG. 13, all light-emitting units are first light-emitting units 11A. That is, the center of the first member 130 of every light-emitting unit is located closer to the center of the light-emitting region 12 than the optical axis OA of the light source 120 is in a plan view.

The direction of deviation of the center of the first member 130 is not limited to the example of the light-emitting module 10A shown in FIG. 12 as long as the center of the first member 130 is located closer to the center of the light-emitting region 12 than the optical axis OA of the light source 120 is in a plan view as described above. For example, as in the light-emitting module 10B shown in FIG. 13, the center of the first member 130 of every first light-emitting unit 11A may be deviated in a direction substantially parallel to one of the diagonals from the optical axis OA of the light source 120 toward the center of the light-emitting region 12 as indicated by the arrow. Also in this case, substantially the same effects as the light-emitting module 10A are obtained.

Figure 14:
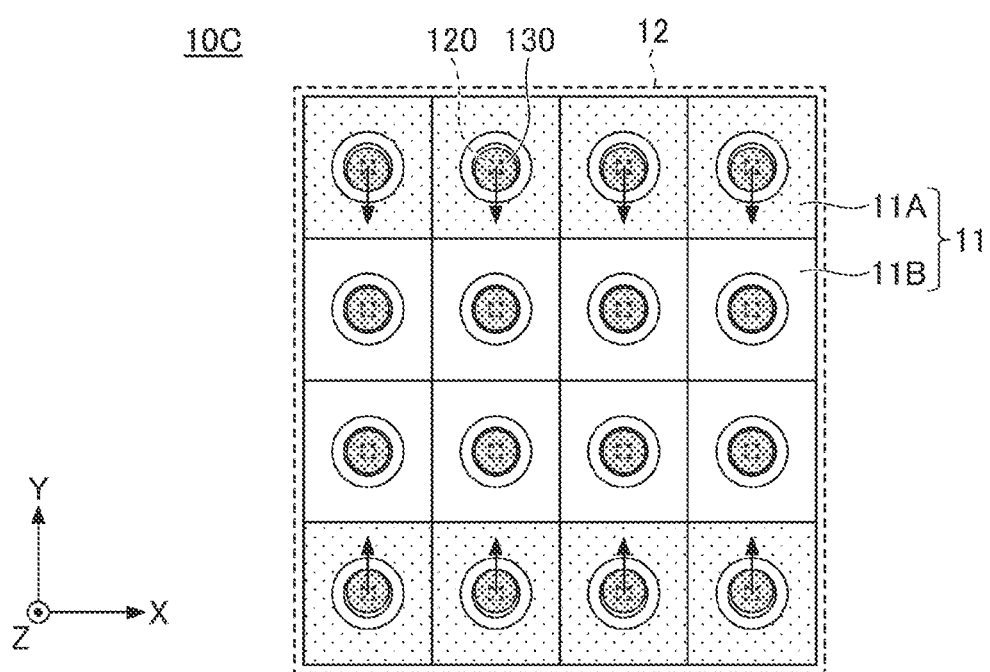
FIG. 14 is a schematic plan view of an illustrative light-emitting module according to a third modification of the first embodiment.

FIG. 14 is a schematic plan view of an illustrative light-emitting module according to a third modification of the first embodiment. In a light-emitting module 10C shown in FIG. 14, the light-emitting region 12 has a rectangular shape having short sides (upper and lower sides) and long sides (right and left sides), and first light-emitting units 11A are located in a single row located at the periphery on each of the short sides opposite to each other. The center of the first member 130 of each first light-emitting unit 11A is deviated in a direction substantially parallel to the long side direction (Y direction) from the optical axis OA of the light source 120 toward the center of the light-emitting region 12 as indicated by the arrow. In other words, the centers of the first members 130 of all the first light-emitting units 11A located on one short side are deviated toward the other short side, and the centers of the first members 130 of all the first light-emitting units 11A located on the other short side are deviated toward the one short side.

In the case in which the light-emitting region 12 has a rectangular shape having short sides and long sides, dark lines are likely to appear on the periphery on the short sides, which are farther from the center of the light-emitting region 12. With deviation of the centers of the first members 130 of the first light-emitting units 11A, which are located at positions shown in FIG. 14, in the directions of the arrows, dark lines can be effectively reduced.

Second Embodiment

An example of a light-emitting module that differs from that in the first embodiment in the arrangements of the light sources and the first members is described as a second embodiment. In the second embodiment, repeated description of the same components as in the embodiment described above may be omitted.

Figure 15:
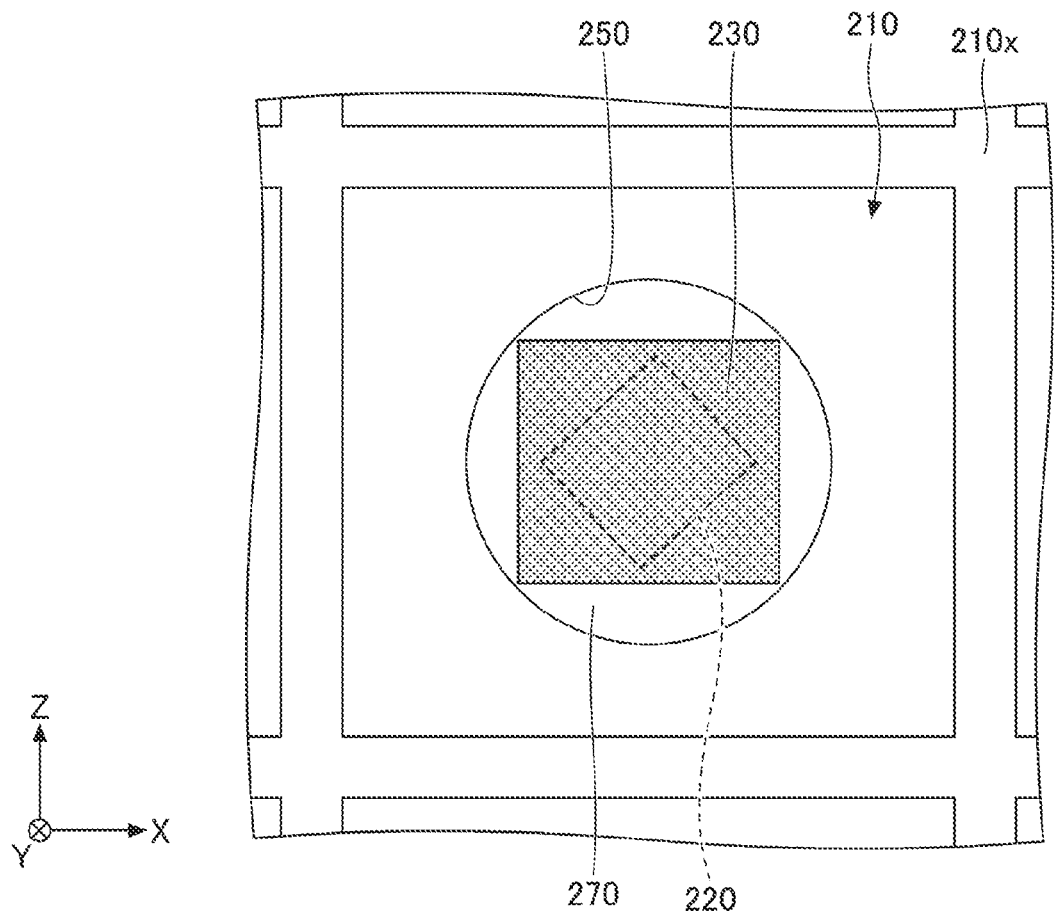
FIG. 15 is a schematic plan view of an illustrative light-emitting module according to a second embodiment of the present disclosure.
Figure 16:
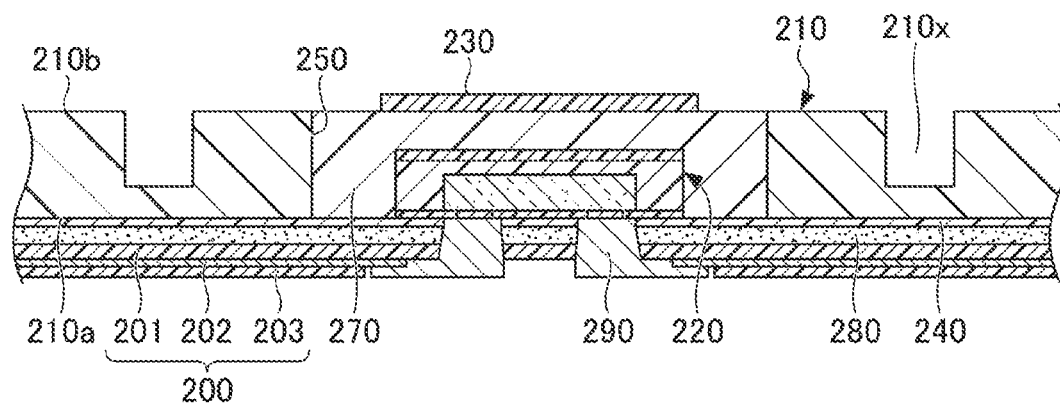
FIG. 16 is a schematic cross-sectional view of the illustrative light-emitting module according to the second embodiment.

FIG. 15 is a schematic plan view of the illustrative light-emitting module according to the second embodiment. FIG. 16 is a schematic cross-sectional view of the illustrative light-emitting module according to the second embodiment. Similarly to the light-emitting module 10 shown in FIG. 1 and FIG. 2, the light-emitting module according to the second embodiment has the light-emitting region 12 in which a plurality of light-emitting units 11 are two-dimensionally arranged, and FIG. 15 and FIG. 16 show the vicinity of a single light-emitting unit 11.

As shown in FIG. 15 and FIG. 16, each light-emitting unit 11 in the light-emitting module according to the second embodiment includes a light-guiding plate 210, the light source 220, and a light-reflective first member 230 located above the light source 220. Each light-emitting unit 11 may include a wiring board 200 on which the light-guiding plate 210 and the light source 220 are disposed and a light-reflective second member 240 located below the light source 220.

The wiring board 200 includes an insulating base member 201, a wiring layer 202 formed on one main surface of the insulating base member 201, and a covering layer 203 formed above the one main surface of the insulating base member 201 to selectively cover the wiring layer 202. For example, the wiring board 200 is flexible. The wiring layer 202 is a member that supplies a light-emitting element constituting the light source 220 with a current (electricity) from an external device and has a pattern separated into two or more portions, which are positive and negative. The insulating base member 201 and the covering layer 203 are formed of, for example, a resin such as polyimides, poly (ethylene naphthalate), and poly(ethylene terephthalate). The wiring layer 202 is formed of, for example, a single-layer film or a layered film containing a metal such as Cu.

On the other main surface of the insulating base member 201 of the wiring board 200, an adhesive layer 280, the second member 240, and the light-guiding plate 210 are layered in order. For the materials of the light-guiding plate 210 and the second member 240, for example, materials described as examples of the materials of the light-guiding plate 110 and the second member 140 can be used.

The light-guiding plate 210 has a first main surface 210a and a second main surface 210b opposite to the first main surface 210a. The first main surface 210a of the light-guiding plate 210 is in contact with the second member 240. The second main surface 210b of the light-guiding plate 210 is the emission surface of the light-emitting module according to the second embodiment. The light-guiding plate 210 is divided into a plurality of two-dimensionally arranged unit regions by grid-like grooves 210x opening toward the second main surface 210b, and the unit regions respectively correspond to the light-emitting units 11. A silicone resin or the like may be disposed in the grooves 210x. The resin or the like disposed in the grooves 210x can contain a light-diffusing material and the like.

A through hole 250 has been bored from the first main surface 210a to the second main surface 210b in each unit region of the light-guiding plate 210. The planar shape of the through hole 250 is, for example, circular. The planar shape of the through hole 250 may be elliptic or rectangular. The light source 220 is disposed in the through hole 250. For example, the light source 220 can be disposed parallel or at an angle of 45° to the long direction of the grooves 210x. A bonding member 290 penetrates through the insulating base member 201 of the wiring board 200, the adhesive layer 280, and the second member 240 to electrically connect the electrodes of the light source 220 to the wiring layer 202. For example, metal paste such as Cu paste can be used for the bonding member 290.

A light-transmissive member 270 covering the upper surface and lateral surfaces of the light source 220 is disposed in the through hole 250. For the light-transmissive member 270, a light-transmissive resin material can be used. Examples of the light-transmissive resin material include resin materials mainly composed of thermosetting resins such as silicone resins, modified silicone resins, epoxy resins, and phenolic resins. For example, the upper surface of the light-transmissive member 270 and the second main surface 210b of the light-guiding plate 210 are in the same plane. On the second main surface 210b of the light source 220, the first member 230 is disposed so as to overlap with the light source 220 in a plan view. Specifically, the first member 230 is disposed on the light-transmissive member 270 covering the light source 220 in the through hole 250. The first member 230 may extend from the light-transmissive member 270 to the second main surface 210b of the light-guiding plate 210.

FIG. 17 is a schematic cross-sectional view of an illustrative light source of the light-emitting module according to the second embodiment. As shown in FIG. 17, the light source 220 in the present embodiment includes a light-emitting element 221, a wavelength conversion member 222, a covering member 223, and a light-reflective member 224. The light-emitting element 221 includes a pair of electrodes 221t. For the light-emitting element 221, for example, a light-emitting element of the same kind as the light-emitting element 121 can be used. The light source 220 is a light-emitting device in which the lateral surfaces mainly serve as the emission surfaces.

The wavelength conversion member 222 covers an emission surface 221b and lateral surfaces 221c of the light-emitting element 221. The lower surface of the wavelength conversion member 222 is in contact with the upper surface of the covering member 223. For example, the lower surface of the wavelength conversion member 222 and an electrode formation surface 221a of the light-emitting element 221 are in the same plane. For example, a material of the same kind as the material of the wavelength conversion member 122 can be used for the wavelength conversion member 222.

The covering member 223 covers the electrodes 221t except for the lower surfaces and covers the electrode formation surface 221a of the light-emitting element 221. For the covering member 223, for example, a material of the same kind as the material of the first member 130 can be used.

The light-reflective member 224 is disposed on the upper surface of the wavelength conversion member 222. The light-reflective member 224 preferably covers the entire upper surface of the wavelength conversion member 222. For the light-reflective member 224, for example, a material of the same kind as the material of the first member 130 can be used.

A lateral surface of the covering member 223, a lateral surface of the wavelength conversion member 222, and a lateral surface of the light-reflective member 224 define a lateral surface of the light source 220. The lateral surface of the covering member 223, the lateral surface of the wavelength conversion member 222, and the lateral surface of the light-reflective member 224 are preferably in the same plane.

Similarly to the case of the light-emitting module 10, the light-emitting module according to the second embodiment includes the first light-emitting unit 11A in which the center of the light-emitting unit coincides with the optical axis of the light source 220 and in which the center of the first member 230 is located closer to the center of the light-emitting region 12 than the optical axis of the light source 220 is in a plan view. The light-emitting module according to the second embodiment may include the second light-emitting unit 11B in which the center of the light-emitting unit coincides with the optical axis of the light source 220 and in which the center of the first member 230 coincides with the optical axis of the light source 220 in a plan view.

When the first light-emitting units 11A and the second light-emitting units 11B are arranged as shown in FIG. 2, FIG. 12, FIG. 13, or FIG. 14 in the light-emitting module according to the second embodiment, similarly to the light-emitting module 10, darkening of the periphery is reduced by increasing light on the peripheral side of the light-emitting region 12, so that the luminance non-uniformity on the peripheral side of the light-emitting region 12 can be reduced.

Figure 18:
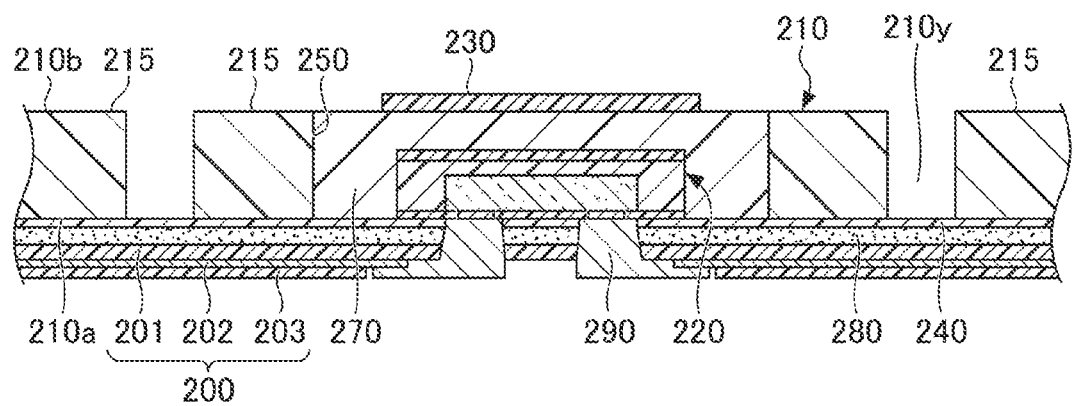
FIG. 18 is a schematic cross-sectional view of an illustrative light-emitting module according to a first modification of the second embodiment.

As shown in FIG. 18, the light-guiding plate 210 may have through holes 210y bored from the first main surface 210a to the second main surface 210b instead of the grid-like grooves 210x opening toward the second main surface 210b. In this case, a single light-guiding plate 215 is provided for each unit region.

Third Embodiment

In a third embodiment, an example of a surface light source including a plurality of light-emitting modules is described. In the third embodiment, repeated description of the same components as in the embodiments described above may be omitted.

Figure 19:
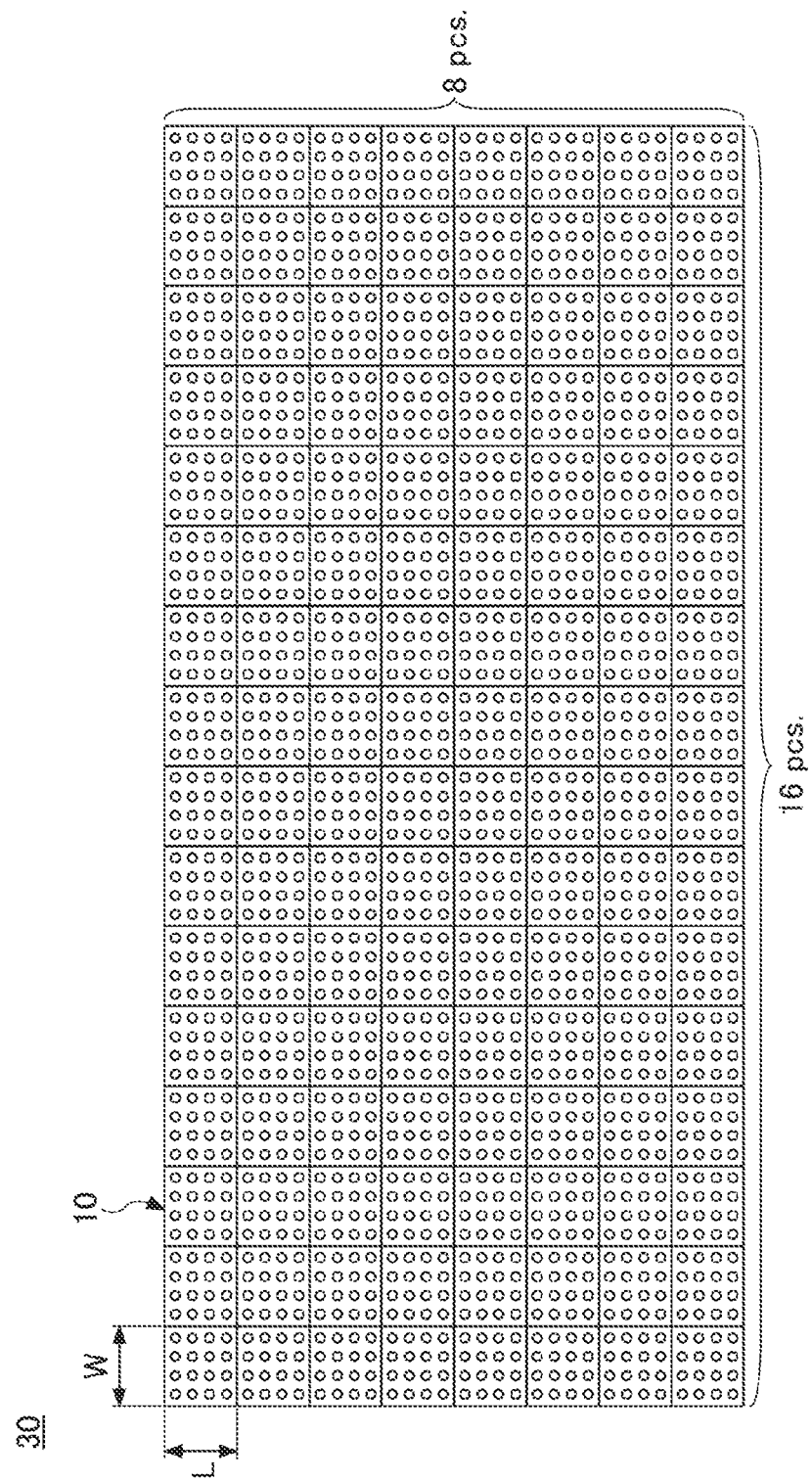
FIG. 19 is a schematic plan view of an illustrative surface light source according to a third embodiment of the present disclosure.

FIG. 19 is a schematic plan view of an illustrative surface light source according to the third embodiment. A surface light source 30 shown in FIG. 19 includes an 8-by-16 array of the light-emitting modules 10 shown in FIG. 1 and other drawings. The surface light source 30 is not limited to the structure in which the light-emitting modules 10 are two-dimensionally arranged, and the light-emitting modules 10 may be one-dimensionally arranged.

The emission surface of the surface light source 30 has a rectangular shape as a whole. In the case in which each light-emitting module 10 has a length L in the length direction of about 24.3 mm and a length W in the width direction of about 21.5 mm, the surface light source 30 conforms to a backlight for an LCD panel of a screen size of 15.6 inches with an aspect ratio of 16:9. As described above, for example, the surface light source 30 can be used for a backlight unit of an LCD panel. With the present embodiment, a surface light source having an emission surface with an even larger area is comparatively easily obtained.

There may be a gap between adjacent light-emitting modules 10 in the surface light source 30. Also in this case, when the first light-emitting units 11A and the second light-emitting units 11B are arranged as shown in FIG. 2, FIG. 12, FIG. 13, or FIG. 14 in each light-emitting module 10, darkening of the periphery is reduced by increasing light on the peripheral side of the light-emitting region 12 of each light-emitting module 10, so that the luminance non-uniformity on the peripheral side of the light-emitting region 12 can be reduced. Accordingly, the luminance non-uniformity of the overall surface light source 30 can be reduced.

Fourth Embodiment

In a fourth embodiment, an example of a liquid-crystal display device including the surface light source 30 as a backlight source is described. In the fourth embodiment, repeated description of the same components as in the embodiments described above may be omitted.

Figure 20:
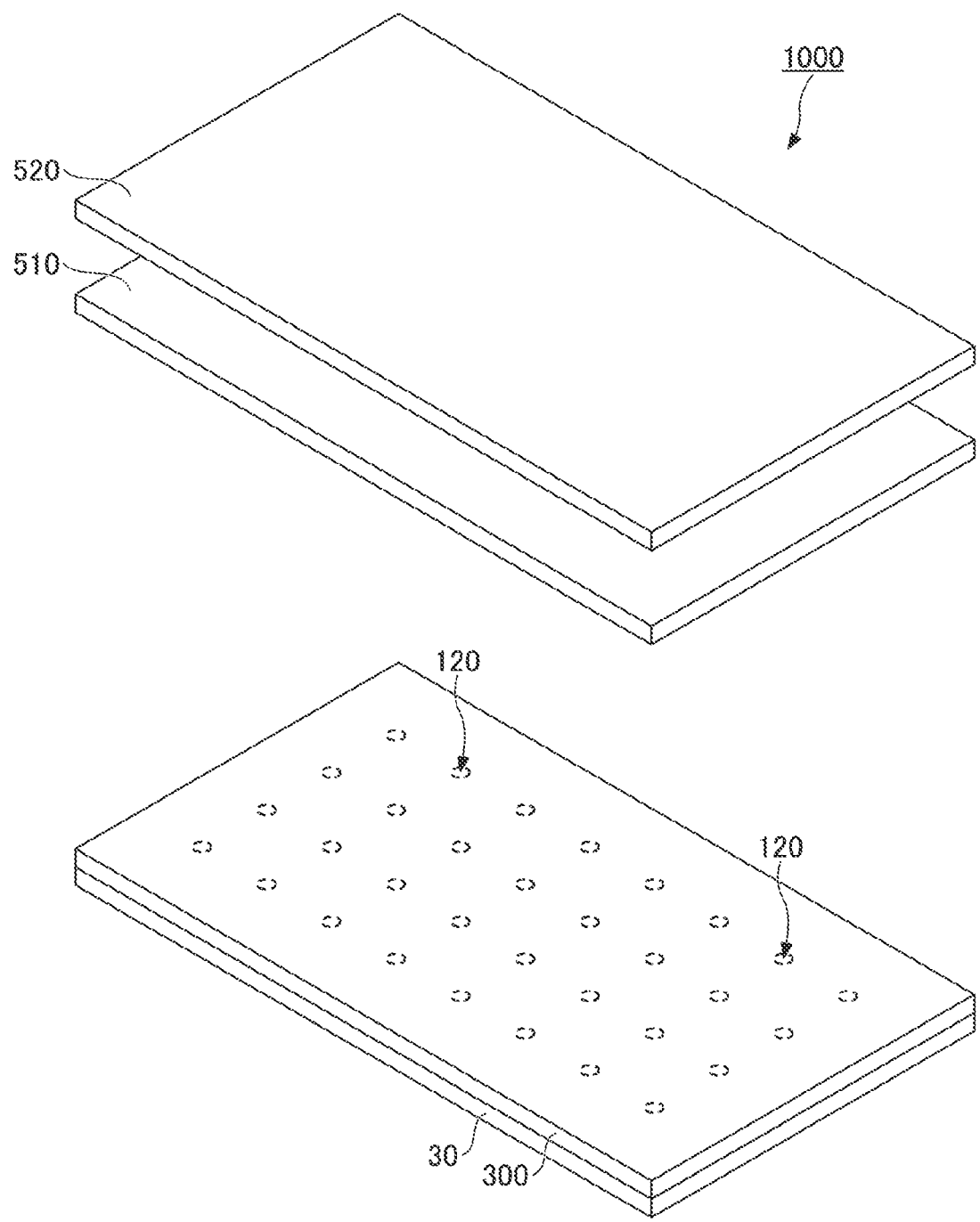
FIG. 20 is a schematic configuration diagram of an illustrative liquid-crystal display device according to a fourth embodiment of the present disclosure.

FIG. 20 is a schematic configuration diagram of the illustrative liquid-crystal display device according to the fourth embodiment. As shown in FIG. 20, a liquid-crystal display device 1000 includes an LCD panel 520, an optical sheet 510, and the surface light source 30 in the order from the top. An optical member 300 may be disposed on the surface light source 30. For example, the optical member 300 includes a light diffusing plate, a prism sheet, and a polarizing sheet. The optical member 300 may include a dual brightness enhancement film (DBEF), a brightness enhancement film (BEF), and a color filter.

The liquid-crystal display device 1000 is what is called a direct-lit liquid-crystal display device in which the surface light source 30 is layered below the LCD panel 520. In the liquid-crystal display device 1000, light emitted from the surface light source 30 is applied to the LCD panel 520.

As the distance between an LCD panel and a surface light source is generally short in a direct-lit liquid-crystal display device, non-uniformity in the color and luminance of the surface light source may affect non-uniformity in the color and luminance of the liquid-crystal display device. A surface light source with less non-uniformity in the color and luminance is therefore desired as a surface light source for a direct-lit liquid-crystal display device. By using the surface light source 30 for the liquid-crystal display device 1000, darkening of the periphery can be reduced, so that non-uniformity in the luminance and color can be reduced while maintaining a reduced thickness of the surface light source 30, such as 5 mm or less, 3 mm or less, and 1 mm or less.

As described above, the surface light source 30 is suitably used for a backlight for the liquid-crystal display device 1000. The light-emitting module 10 or the like may be used for the backlight for the liquid-crystal display device 1000 instead of the surface light source 30.

The use described above is not limiting, and the light-emitting module 10 and the surface light source 30 can be suitably used as a backlight for a television, a tablet, a smartphone, a smartwatch, a head-up display, digital signage, or a bulletin board. The light-emitting module 10 and the surface light source 30 can also be used as a light source for lighting for an emergency light, a linear lighting, various illuminations, or vehicle installation.

Preferable embodiments and the like have been described above in detail, but the embodiments and the like described above are not limiting. Various modifications and replacement can be performed on the embodiments and the like described above within the scope of the claims.

What is claimed is:

1. A light-emitting module having a light-emitting region including a plurality of light-emitting units two-dimensionally arranged, the light-emitting units each comprising:
a light-guiding plate having a first main surface, a second main surface opposite to the first main surface, and a through hole bored from the first main surface to the second main surface;
a light source inside the through hole; and
a light-reflective first member located on a second main surface side of the light source to overlap with the light source in a plan view,
wherein, in each of the light-emitting units, a center of the light-emitting unit coincides with an optical axis of the light source in a plan view, and
wherein, in at least one of the light-emitting units, a center of the first member is closer to a center of the light-emitting region than the optical axis of the light source is in a plan view.

2. The light-emitting module according to claim 1, wherein the first member is disposed on or above a light-transmissive member covering the light source in the through hole.

3. The light-emitting module according to claim 1, wherein every one of the light-emitting units is a first light-emitting unit in which the center of the first member is located closer to the center of the light-emitting region than the optical axis of the light source is in a plan view.

4. The light-emitting module according to claim 1, wherein the plurality of light-emitting units comprise:
at least one first light-emitting unit in which the center of the first member is located closer to the center of the light-emitting region than the optical axis of the light source is in a plan view; and
at least one second light-emitting unit in which the center of the first member coincides with the optical axis of the light source in a plan view, and
wherein the second light-emitting unit is located closer to the center of the light-emitting region than the first light-emitting unit is in the light-emitting region.

5. The light-emitting module according to claim 3, wherein the at least one first light-emitting unit comprises a plurality of first light-emitting units, and
wherein the first light-emitting units occupy the whole of any one row or column on a periphery of the light-emitting region.

6. The light-emitting module according to claim 3, wherein the at least one first light-emitting unit comprises a plurality of first light-emitting units, and
wherein the first light-emitting units occupy the whole of any two rows or columns on a periphery of the light-emitting region.

7. The light-emitting module according to claim 3, wherein the first light-emitting unit is located at a periphery of the light-emitting region.

8. The light-emitting module according to claim 3, wherein at least one of the first light-emitting unit is located at a position other than a periphery of the light-emitting region.

9. A surface light source comprising the light-emitting modules according to claim 1, the light-emitting modules being one-dimensionally or two-dimensionally arranged.

10. A liquid-crystal display device comprising the light-emitting module according to claim 1 as a backlight source.

11. The light emitting module according to claim 1, wherein the light-guiding plate has a groove opening toward the second main surface.

12. The light-emitting module according to claim 1, wherein the light-emitting region has a rectangular shape having short sides and long sides,
wherein the at least one first light-emitting unit comprises a plurality of first light-emitting units, and
wherein the first light-emitting units are located at the periphery on the short sides opposite to each other.

13. The light-emitting module according to claim 12,
wherein the center of the first member in every one of the first light-emitting unit located on one short side is deviated toward the other short side, and
wherein the center of the first member in every one of the first light-emitting unit located on the other short side is deviated toward the one short side.

14. A liquid-crystal display device comprising the surface light source according to claim 9 as a backlight source.

15. A surface light source comprising the light-emitting modules according to claim 2, the light-emitting modules being one-dimensionally or two-dimensionally arranged.

16. A liquid-crystal display device comprising the light-emitting module according to claim 2 as a backlight source.

17. A liquid-crystal display device comprising the surface light source according to claim 15 as a backlight source.

18. The surface light source according to claim 9,
wherein the light-guiding plate has a groove opening toward the second main surface.

19. The liquid-crystal display device according to claim 10,
wherein the light-guiding plate has a groove opening toward the second main surface.

20. The liquid-crystal display device according to claim 17,
wherein the light-guiding plate has a groove opening toward the second main surface.

* * * * *